United States Patent [19]
Miwada

[11] Patent Number: 5,224,134
[45] Date of Patent: Jun. 29, 1993

[54] CHARGE TRANSFER DEVICE HAVING CIRCUIT FOR ADJUSTING THE HIGH LEVEL OF THE RESET PULSE

[75] Inventor: Kazuo Miwada, Tokyo, Japan

[73] Assignee: NEC Corporation, Tokyo, Japan

[21] Appl. No.: 667,155

[22] Filed: Mar. 11, 1991

[30] Foreign Application Priority Data

Mar. 10, 1990 [JP] Japan ................. 2-58989

[51] Int. Cl.[5] ............ H01L 29/78; G11C 19/28
[52] U.S. Cl. ................ 377/60; 377/58; 377/63; 257/239
[58] Field of Search .............. 377/57-63; 357/24, 24 M; 307/530, 578, 362, 546, 555, 607, 491, 296.1

[56] References Cited

U.S. PATENT DOCUMENTS

| | | | |
|---|---|---|---|
| 4,627,083 | 12/1986 | Pelgrom et al. | 377/60 |
| 4,974,239 | 11/1990 | Miwada | 377/60 |
| 4,974,240 | 11/1990 | Suzuki et al. | 377/60 |
| 4,996,686 | 2/1991 | Imai et al. | 377/60 |
| 5,033,068 | 7/1991 | Imai | 377/60 |

*Primary Examiner*—William L. Sikes
*Assistant Examiner*—Tai V. Duong

*Attorney, Agent, or Firm*—Sughrue, Mion, Zinn, Macpeak & Seas

[57] ABSTRACT

A charge transfer device comprises a charge transfer section having a charge transfer region formed in a semiconductor substrate and transfer electrodes formed on the semiconductor substrate, and a reset transistor having a floating diffusion region formed in the semiconductor substrate for receiving an electric charge transferred from the charge transfer section, a reset drain applied with a reset voltage, and a reset gate formed above a channel between the floating diffusion region and the reset drain, the reset gate being applied with a reset pulse. A a peak hold circuit is connected to the reset gate of the reset transistor for hold a peak level of the reset voltage. A potential detection circuit includes a dummy transistor having a drain connected to a voltage $V_{DD}$, a source grounded through a resistor which is considerably larger than an on-resistance of the dummy transistor itself, and a gate electrode connected to an output of the peak hold circuit. The dummy transistor has the same characteristics as that of the reset transistor, and the drain of the dummy transistor is directly connected to the reset drain of the reset transistor.

5 Claims, 6 Drawing Sheets

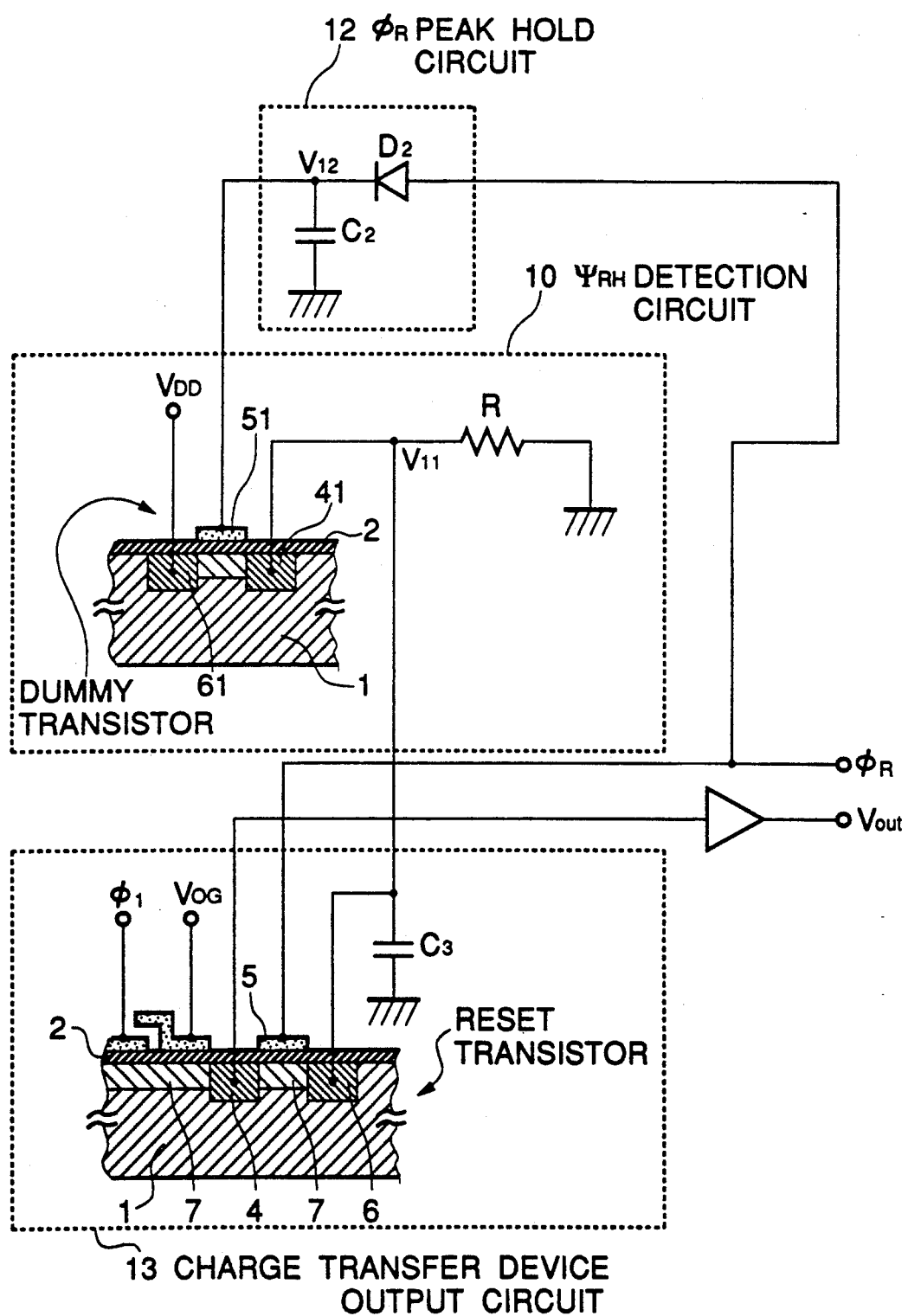

CHARGE TRANSFER DEVICE HAVING CIRCUIT FOR ADJUSTING THE HIGH LEVEL OF THE RESET PULSE

BACKGROUND OF THE INVENTION

1. Field of the Invention

The present invention relates to a charge transfer device, and more specifically, to an output circuit for a charge transfer device including an electrically floating diffusion at a substrate surface.

2. Description of Related Art

In general, charge transfer devices having a buried channel have comprised an output circuit requiring a high voltage for a reading of a transferred charge. On the other hand, most of the present systems are of a 5 V voltage supply type, and therefore, have a pumping-up circuit for generating a high voltage and a DC clamp circuit receiving the generated high voltage for supplying a calibrated high voltage to the output circuit for the charge transfer device. However, since the charge transfer devices inevitably have dispersion or variation in manufacture, for example, a potential of a channel under a reset gate also has dispersion or variation. In order to compensate the dispersion or variation of the channel potential, it has been necessary to make a complicated adjustment for a reset pulse voltage.

SUMMARY OF THE INVENTION

Accordingly, it is an object of the present invention to provide a charge transfer device which has overcome the above mentioned defect of the conventional one.

Another object of the present invention is to provide a charge transfer device capable of automatically compensating the channel potential variation.

The above and other objects of the present invention are achieved in accordance with the present invention by a charge transfer device comprising:

a charge transfer section having a charge transfer region formed in a semiconductor substrate and transfer electrodes formed on the semiconductor substrate;

a reset transistor having a floating diffusion region formed in the semiconductor substrate for receiving an electric charge transferred from the charge transfer section, a reset drain applied with a reset voltage, and a reset gate formed above a channel between the floating diffusion region and the reset drain, the reset gate being applied with a reset pulse;

potential detection means for detecting a potential of a channel of the reset transistor when the reset transistor is in a resetting operation; and voltage following means for causing the potential of the channel of the reset transistor when the reset transistor is in the resetting operation, to follow the reset voltage.

Preferably, the voltage following means operates to make the potential of the channel of the reset transistor when the reset transistor is in the resetting operation, consistent with the reset voltage.

In place of causing the potential of the channel of the reset transistor to follow the reset voltage, the voltage following means can cause the reset voltage when the reset transistor is in the resetting operation, to follow the voltage detected by the potential detection means. Preferably, the voltage following means operates to make the reset voltage when the reset transistor is in the resetting operation, consistent with the voltage detected by the potential detection means.

The above and other objects, features and advantages of the present invention will be apparent from the following description of preferred embodiments of the invention with reference to the accompanying drawings.

BRIEF DESCRIPTION OF THE DRAWINGS

FIG. 7 is a circuit diagram of another embodiment of the charge transfer device in accordance with the present invention.

DESCRIPTION OF THE PREFERRED EMBODIMENTS

Figure 1A:
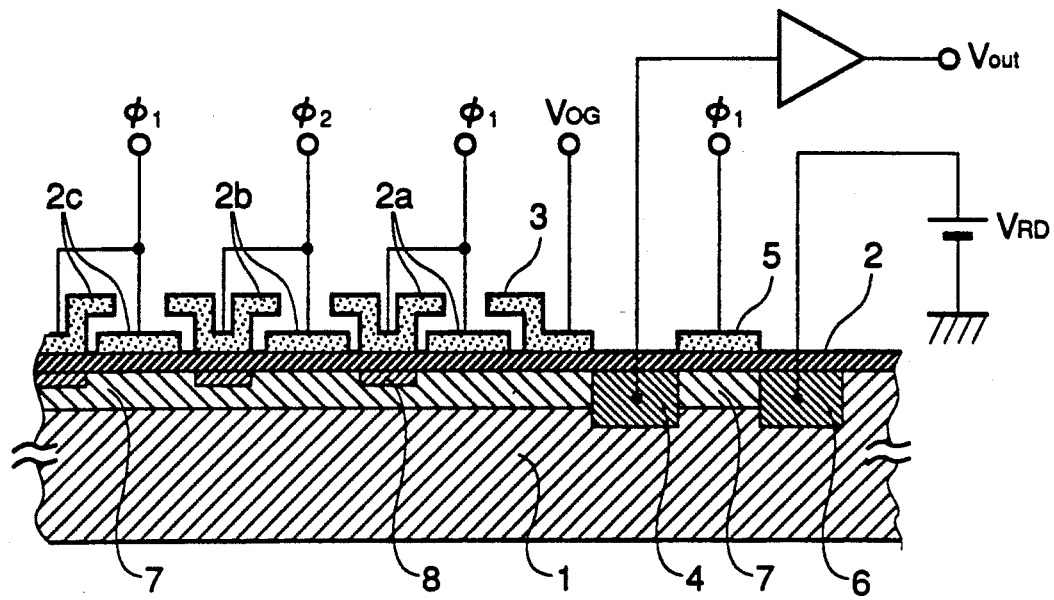
FIG. 1A is a diagrammatic sectional view of a conventional buried channel type charge transfer device.

Referring to FIG. 1A, there is shown a diagrammatic sectional view of a conventional buried channel type charge transfer device.

In FIG. 1A, the charge transfer device includes a p-type semiconductor substrate 1 having an upper surface coated with an insulating layer 2. Transfer electrodes 2a, 2b and 2c and an output gate 3 are provided on the insulating layer 2. The transfer electrodes 2a, 2b and 2c are applied with a two-phase transfer clock, namely, are alternately applied with clocks $\phi_1$ and $\phi_2$ opposite to each other in phase, and the output gate 3 is connected to a fixed output gate voltage $V_{OG}$. A floating diffusion 4 is formed at a surface region of the substrate 1 under the insulating layer 2 so as to convert a transferred signal charge into a potential change. Adjacent to the floating diffusion 4, a reset gate 5 is formed on the insulating layer 2. This reset gate 5 is connected to receive a reset pulse $\phi_R$ in synchronism with the transfer clock. In addition, a reset drain 6 is formed at the surface region of the substrate 1 under the insulating layer 2 and adjacent to the reset gate 5. This reset drain 6 is connected to a constant reset voltage $V_{RD}$. The floating diffusion 4, the reset gate 5 and the reset drain 6 form a reset transistor of a MOS type.

An n-type diffusion layer 7 is formed at the surface region of the substrate so as to form a buried channel of the charge transfer section and a channel of the reset transistor, and a plurality of p-type barrier layers 8 are formed in the n-type diffusion layer 7.

Operation of the charge transfer device will be explained with reference to FIGS. 1B and 1C which illustrate two different conditions of potential wells formed in the charge transfer device shown in FIG. 1A.

Figure 1B:
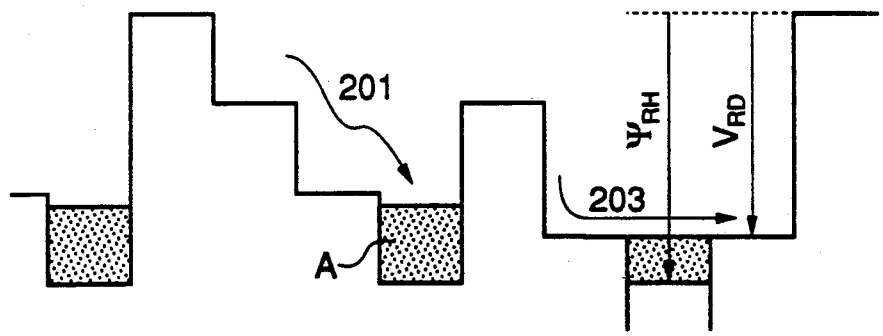
FIGS. 1B and 1C illustrate two different conditions of potential wells formed in the charge transfer device shown in FIG. 1A.

(1) When the clock $\phi_1$ applied to the transfer electrodes 2a and 2c of the charge transfer device is at a high level and the clock $\phi_2$ applied to the transfer electrodes 2b is at a low level, an electric charge flows as indicated by an arrow 201 and is accumulated at a region under an output side electrode of the transfer electrodes 2a (FIG. 1B).

Figure 1C:
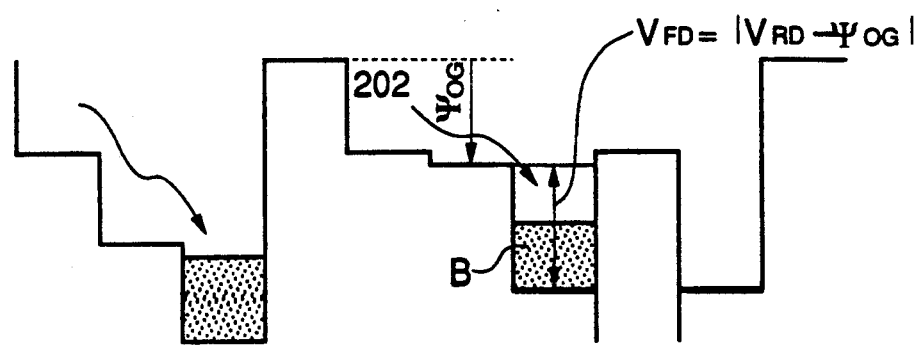

(2) When the clock $\phi_1$ applied to the transfer electrodes 2a and 2c is brought to the low level and the clock $\phi_2$ applied to the transfer electrodes 2b is brought to the high level, the electric charge accumulated at the region under the output side electrode of the transfer electrodes 2a flows into the floating diffusion 4 through a channel region under the output gate 3 applied with the fixed output gate voltage $V_{OG}$, as indicated by an arrow 202 (FIG. 1C). Thus, the signal charge is detected in the form of a voltage signal.

(3) When the clocks applied to the transfer electrodes 2a, 2b and 2c are brought into the same condition as the above condition (1), again, and when the reset pulse $\phi_R$ is brought into a high level, the signal charge flows as indicated by an arrow 203 so that the signal charge is extracted out of the reset drain 6.

With repetition of the above process, signal charges which have been transferred to the output circuit are sequentially read out in the form of a signal voltage.

In the above mentioned charge transfer device, the amount of charge which can be converted into a voltage by the floating diffusion 4 is determined by a difference $\Delta V_{FD}$ between the reset voltage $V_{RD}$ applied to the reset drain 6 and a potential $\Psi_{OG}$ under the output gate 3 applied with the output gate voltage $V_{OG}$. $\Delta V_{FD} = |V_{RD} - \Psi_{OG}|$. The value of $\Delta V_{FD}$ is required to be not less than a certain constant value in order to ensure a required dynamic range.

Figure 2:
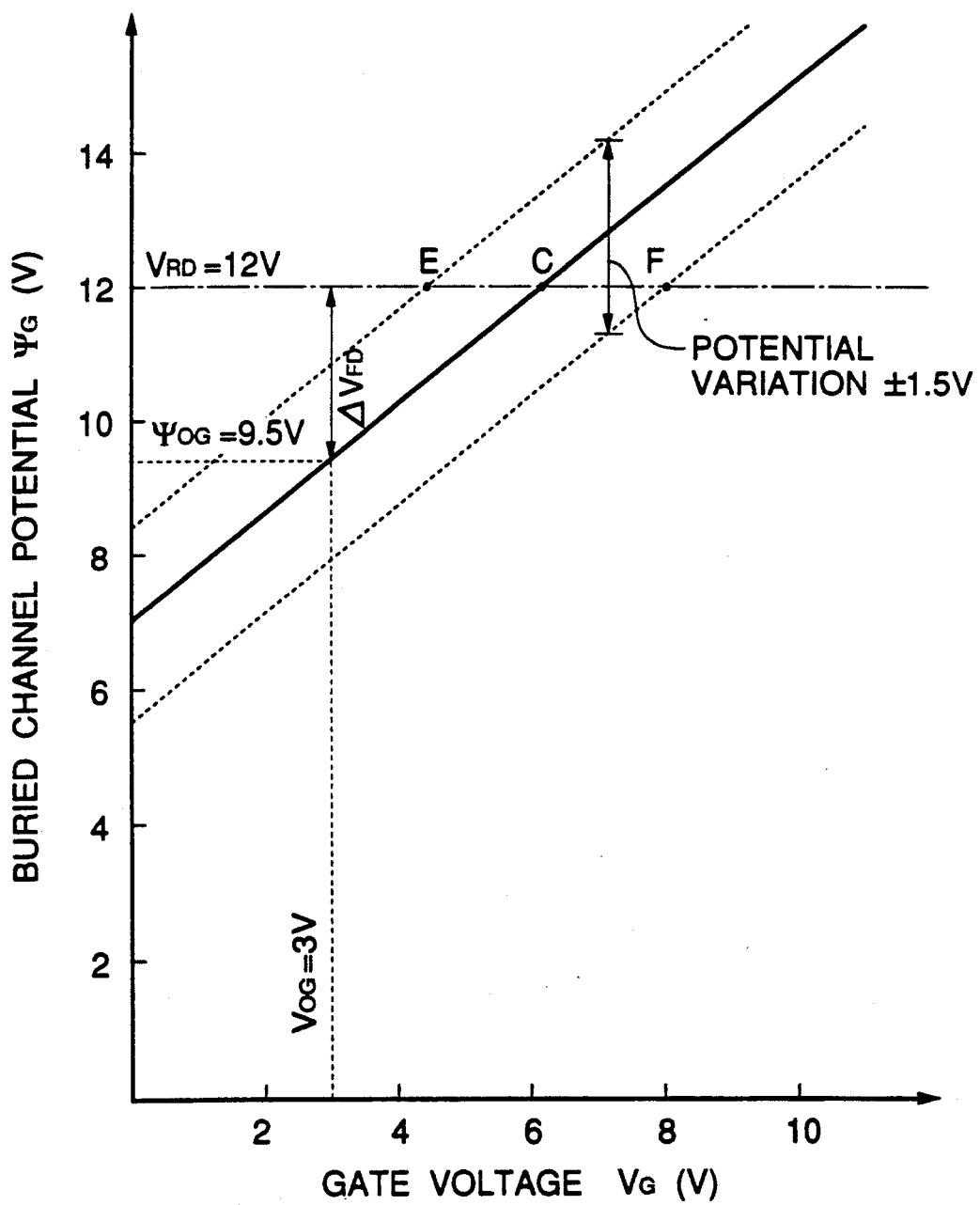
FIG. 2 is a graph illustrating a relation between a gate voltage and a buried channel potential.

In the case of a buried channel, a gate voltage and a buried channel potential have a relation as shown in FIG. 2. Namely, as seen from FIG. 2, the buried channel potential $\psi_G$ under the gate electrode is considerably higher than the gate electrode voltage $V_G$. On the other hand, in order to ensure that the signal charge is smoothly transferred from a region under the transfer electrodes 2a through a region under the output gate electrode 3, the potential of the region under the output gate 3 is required to be deeper than the potential when transfer electrode 2a is at the low level ($\psi_G = 7$ V). In ordinary cases, therefore, the output gate is applied with the output gate voltage of $V_{OG} = 3$ V, so that the potential of the region under the output gate 3 is brought into $\psi_{OG} = 9.5$ V.

Accordingly, in order to ensure the dynamic range of $\Delta V_{FD} = 2.5$ V, the reset voltage $V_{RD}$ must be set to as a high voltage as 12 V, as seen from FIG. 2. If it is set that $V_{RD} = 12$ V, the channel potential $\psi_{RH}$ when the reset pulse $\phi_R$ is at the high level is at least required to be higher than $V_{RD}$ (namely, higher than the point C in FIG. 2). Therefore, the high level of the reset pulse $\phi_R$ is required to have as a high potential as 6.5 V.

Figure 3A:
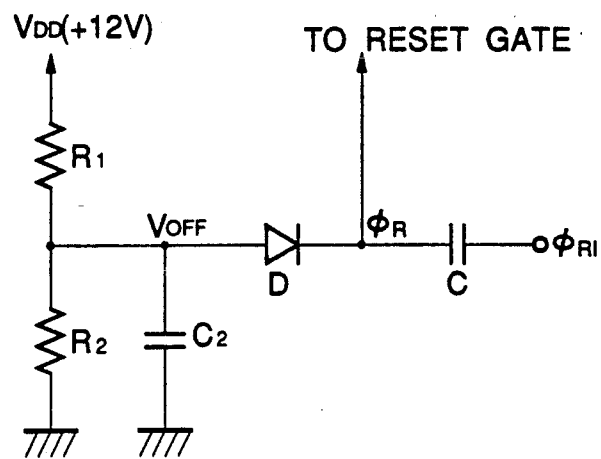
FIG. 3A is a circuit diagram of a DC clamp circuit for adjusting the reset pulse $\phi_R$ applied to the output circuit of the charge transfer device.
Figure 3B:
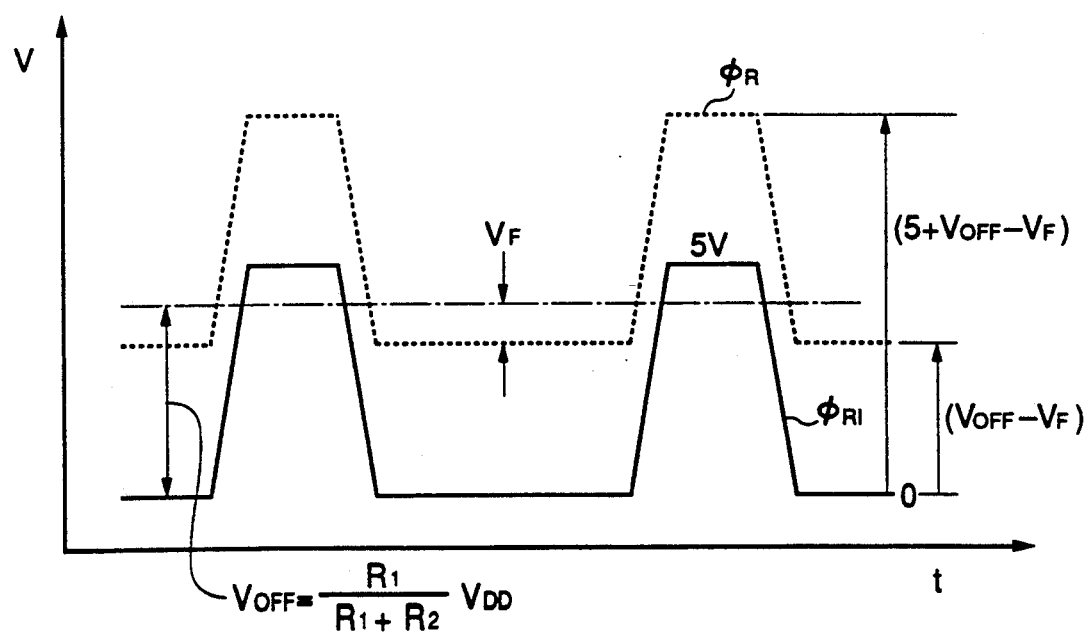
FIG. 3B is a timing chart illustrating an operation of the clamp circuit shown in FIG. 3A.

In comparison with the above mentioned voltage condition, most of ordinary systems are of a 5 V voltage supply type, and therefore, the reset voltage $V_{RD}$ is obtained by pumping up the voltage supply voltage to 12 V. The reset pulse $\phi_R$ is obtained by a DC clamp circuit using a diode D as shown in FIG. 3A. This clamp circuit operates to clamp a low level of an input pulse $\phi_{R1}$ to a voltage $V_{OFF}$ determined by a voltage divider formed of resistors $R_1$ and $R_2$. Precisely, as seen from FIG. 3B which is a timing chart illustrating an operation of the clamp circuit shown in FIG. 3A, since the low level of the input pulse $\phi_{R1}$ becomes lower than $V_{OFF}$ by a forward direction voltage drop of the diode D, the low level of the reset pulse $\phi_R$ is level-shifted to $(V_{OFF} - V_F)$ and the high level of the reset pulse $\phi_R$ is level-shifted to $(5 + V_{OFF} - V_F)$.

However, the potential $\psi_G$ of the buried channel in relation to the gate voltage $V_G$ ordinarily has a manufacture dispersion or variation of $\pm 1.5$ V. Therefore, the high level voltage of the reset pulse $\phi_R$ is required to be capable of being changed within a range from a point F to a point F in FIG. 2, namely in the range of 4.5 V to 8.0 V. This means that the voltage $V_{OFF}$ in the DC clamp circuit shown in FIG. 3A is required to be modified in order to compensate the manufacture dispersion or variation. For this purpose, it becomes necessary to adjust the resistance of the resistor $R_1$ or $R_2$ in the conventional circuit, which needs a very complicated adjustment.

Figure 4:
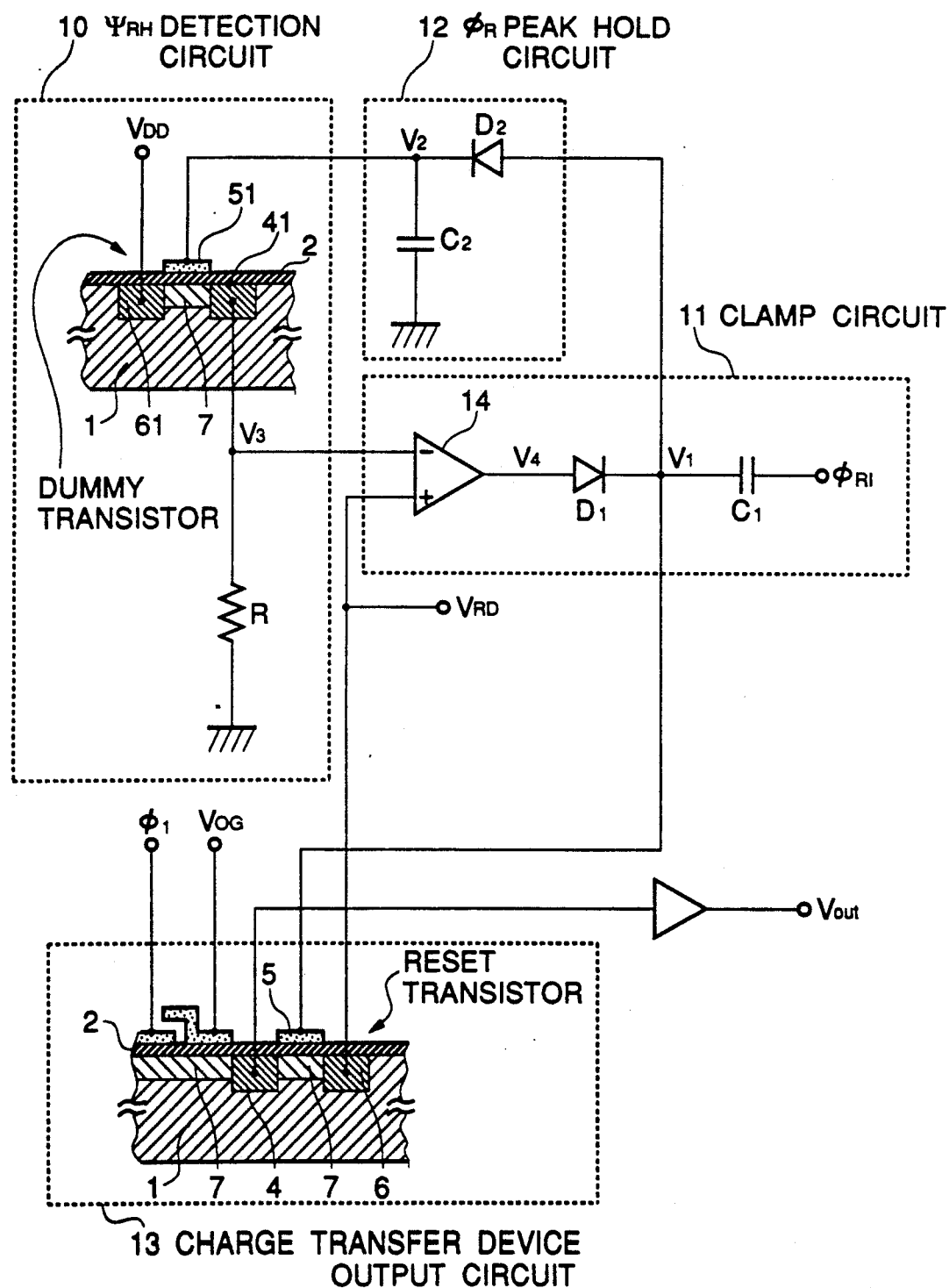
FIG. 4 is a circuit diagram of one embodiment of the charge transfer device in accordance with the present invention.

Referring to FIG. 4, there is shown a circuit diagram of a first embodiment of the charge transfer device in accordance with the present invention. In FIG. 4, elements corresponding to those shown in FIG. 1 are given the same Reference Numerals, and explanation thereof will be omitted.

The shown charge transfer device has a $\psi_{RH}$ detection circuit 10 for detecting a potential $\psi_{RH}$ of a channel under a reset gate 5 when the reset pulse $\phi_R$ is at a high level, and a clamp circuit 11 including a comparator 14, a diode $D_1$ having an anode connected to an output of the comparator 14, and a capacitor $C_1$ having one end connected to a cathode of the diode D1. The clamp circuit 11 compares a channel potential $\psi_{RH}$ with a reset voltage $V_{RD}$ so as to automatically control a high level of the reset pulse $\phi_R$ for the purpose of realizing a relation of $\psi_{RH} = V_{RD}$. The shown charge transfer device also includes a $\phi_R$ peak hold circuit 12 composed of a diode D2 having an anode connected to the cathode of the diode D1 and a capacitor C2 having one end connected to an anode of the diode D2 and the other connected to ground. The $\phi_R$ peak hold circuit 12 operates to hold a high level of the reset pulse $\phi_R$. Reference Numeral 13 designates an output circuit of a charge transfer device to be properly operated.

The $\psi_{RH}$ detection circuit 10 includes a MOS transistor composed of a source region 41 and a drain region 61 formed in the p-type substrate 1, and an n-type diffusion region 7 formed between the source region 41 and the drain region 61. The insulating layer 2 covers the source region 41, the n-type diffusion region 7 and the drain region 61 formed in the p-type substrate 1. A gate electrode 51 is formed on the insulating layer 2 above the n-type diffusion region 7 formed between the source region 41 and the drain region 61. The MOS transistor of the $\psi_{RH}$ detection circuit 10 is a dummy transistor having the same characteristics in size, in voltage gain, in threshold and in others, as those of a MOS transistor (the reset transistor) formed of the floating diffusion 4, the reset gate 5 and the reset drain 6 in the charge transfer device output circuit 13.

The drain 61 of the dummy transistor is connected to a high voltage $V_{DD}$ which is not less than the reset voltage $V_{RD}$. On the other hand, the source 41 is grounded through a resistor R having a resistance which is several times of an on-resistance of the dummy transistor. The gate electrode 51 is connected to the cathode of the diode D2 of the $\phi_R$ peak hold circuit 12.

Figure 5:
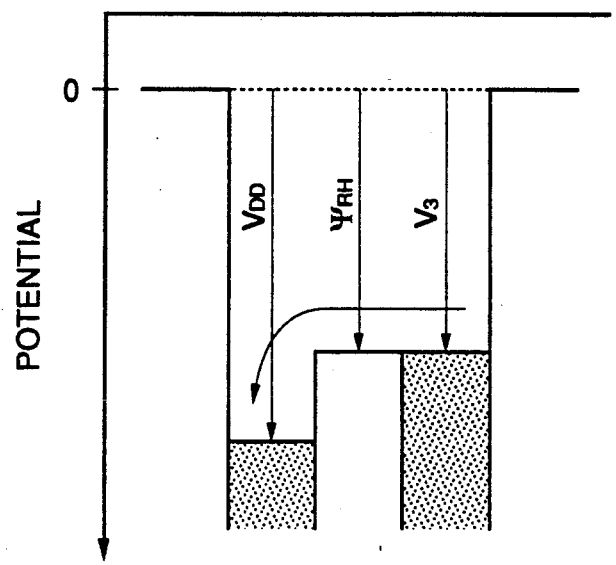
FIG. 5 illustrates a potential well in the output circuit of the charge transfer device shown in FIG. 4.

An operation of the $\psi_{RH}$ detection circuit 10 will be described with reference to FIG. 5 illustrating the potential well formed in the dummy transistor of the $\psi_{RH}$ detection circuit 10.

Neglecting the forward direction voltage drop $V_F$ of the diode $D_2$, the high level of the reset pulse $\phi_R$ is outputted as an output voltage $V_2$ of the $\phi_R$ peak hold circuit 12 and applied to the gate 51. Therefore, the potential of a channel under the gate 51 becomes the same as the potential of the channel under the reset gate 5 when the reset pulse $\phi_R$ is at the high level. Under this situation, a source potential $V_3$ of the dummy transistor becomes equal to the potential $\psi_{RH}$ of the channel under the gate 51, as shown in FIG. 5. The reason for this is that electrons flow into the source 41 through the resistor R, but only a portion of the electrons flowed into the source exceeding the channel potential $\psi_{RH}$ under the gate electrode 51 is absorbed into the drain 61 applied with the voltage $V_{DD}$. Therefore, the channel potential $\psi_{RH}$ can be detected in the form of the source voltage $V_3$ ($V_3 = \psi_{RH}$), and the detected voltage is compared with the reset voltage $V_{RD}$ of the charge transfer device output circuit 13 by the comparator 14 of the clamp circuit 11.

Figure 6:
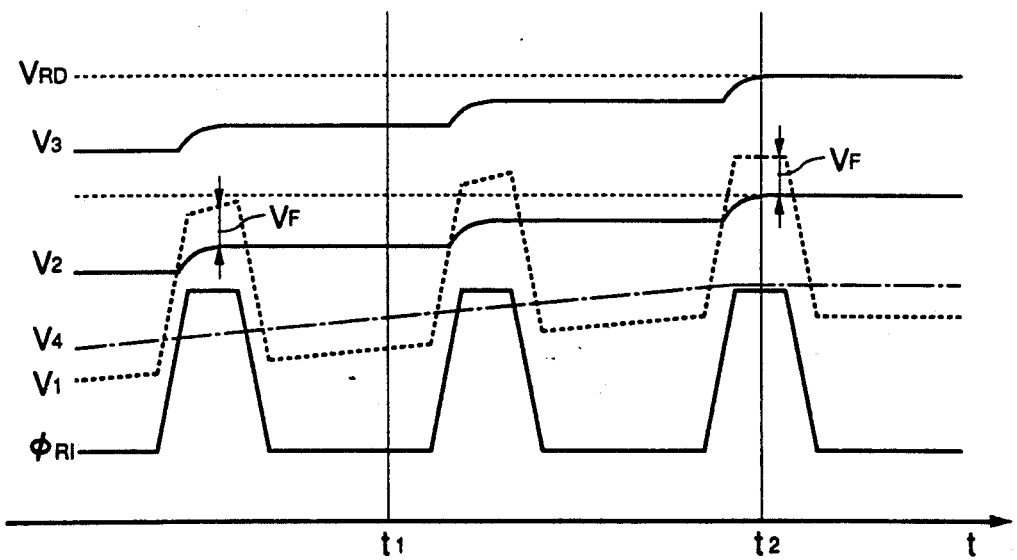
FIG. 6 is a timing chart illustrating an operation of the charge transfer device shown in FIG. 4.

Now, an operation of the clamp circuit 11 will be explained with reference to FIG. 6.

Assuming that $V_{RD} > V_3$ at a time $t_1$, an output voltage $V_4$ of the comparator 14 rises. As shown in FIG. 6, the rise of the output voltage $V_4$ of the comparator 14 causes to raise a DC component of an output of $V_1$ of the clamp circuit 11 which is a level shifted output of an input pulse $\phi_{R1}$. The output of $V_1$ of the clamp circuit 11 is applied to the reset gate 5 as the reset pulse, and a peak value of the output $V_1$ of the clamp circuit 11 is held in the $\phi_R$ peak hold circuit 12. Actually, the output voltage $V_2$ of the $\phi_R$ peak hold circuit 12 is lower than the peak value of the clamp circuit output $V_1$ by the forward direction voltage drop $V_F$ of the diode $D_2$. Therefore, the rise of the output voltage $V_4$ of the comparator 14 raises the output voltage $V_2$ of the $\phi_R$ peak hold circuit 12. The rise of the output voltage $V_2$ of the $\phi_R$ peak hold circuit 12 causes to raise the output voltage $V_3$ of the $\psi_{RH}$ detection circuit 10. Finally, the above mentioned feedback loop operation is repeated until it becomes $V_3 = V_{RD}$.

At a time $t_2$ when it becomes $V_3 = V_{RD}$, the high level of the reset pulse $\phi_R$ is higher than a required minimum voltage by the forward direction voltage drop $V_F$ of the diode $D_2$. Since this forward direction voltage $V_F$ of the diode $D_2$ exists as a voltage margin, it is preferable. Thus, an ideal high level of the reset pulse $\phi_R$ can be set.

As seen from the above, the first embodiment shown in FIG. 4 operates to automatically adjust the reset pulse $\phi_R$ to the effect that the potential $\psi_{RH}$ of the channel under the reset gate 5 is ceaselessly consistent with the reset voltage $V_{RD}$ (or slightly deeper than $V_{RD}$). Therefore, it is possible to avoid the disadvantage in which the channel potential $\psi_{RH}$ varies in relation to the same reset pulse $\phi_R$. In addition, it is also possible to avoid a troublesome or complicated procedure of a resistance adjustment for the level adjustment of the reset pulse $\phi_R$.

Turning to FIG. 7, there is shown a circuit diagram of a second embodiment of the charge transfer device in accordance with the present invention. In FIG. 7, elements corresponding to those shown in FIG. 4 are given the same Reference Numerals, and a detail explanation thereof will be omitted.

The second embodiment of the charge transfer device in accordance with the present invention includes the $\psi_{RH}$ detection circuit 10 for detecting the potential $\psi_{RH}$ of the channel under the reset gate 5 when the reset pulse $\phi_R$ is at the high level, the $\phi_R$ hold circuit for holding the peak level of the reset pulse $\phi_R$, and an output circuit 13 of the charge transfer device, similarly to the first embodiment. However, The second embodiment does not include the clamp circuit 12 provided in the first embodiment. The second embodiment is characterized in that the high level and the low level of the reset pulse $\phi_R$ are fixed, and the source 41 of the dummy transistor is directly connected to the reset drain 6 of the reset transistor and also grounded through a capacitor $C_3$. Therefore, the second embodiment does not control the high level of the reset pulse $\phi_R$. As a substitution, the second embodiment is configured to cause the drain voltage $V_{RD}$ to follow the potential $\psi_{RH}$ of the channel under the reset gate when the fixed high level of the reset pulse $\phi_R$ is applied.

Now, an operation of the second embodiment will be explained. Assuming that the reset pulse $\phi_R$ is supplied from an external device, the $\phi_R$ peak hold circuit 12 holds a high level of the reset pulse $\phi_R$, and outputs an output voltage $V_{12}$, which is consistent with the high level of the reset pulse $\phi_R$, if it is assumed that the forward direction voltage drop of the diode $D_2$ is zero. The output voltage $V_{12}$ is applied to the gate 51 of the dummy transistor. As a result, the channel potential of the dummy transistor becomes equal to the channel potential $\psi_{RH}$ of the reset transistor when the reset pulse $\phi_R$ is at the high level, similarly to the first embodiment. Therefore, this channel potential $\psi_{RH}$ is outputted from the dummy transistor in the form of the source voltage $V_{11}$ of the dummy transistor and applied to the reset drain 6 of the reset transistor.

With the above mentioned arrangement, the channel potential $\psi_{RH}$ at the time of resetting can be made consistent with the potential of the reset drain. Accordingly, it is possible to avoid a troublesome level adjustment of the reset pulse $\phi_R$.

As seen from the above, the second embodiment has a circuit construction greatly simpler than that of the first embodiment.

The above mentioned embodiments have been a buried channel type charge transfer device. However, the present invention can be applied to a surface channel type charge transfer device. In addition, even if the conduction type of the respective regions in the charge transfer devices can also be inverted, the present invention can also be applied.

In the second embodiment, a buffer can be inserted between the source 41 of the dummy transistor and the reset drain of the reset transistor. In this modification, it is possible to suppress a potential variation occurring at the time of the resetting.

As seen from the above, the charge transfer circuit in accordance with the present invention is characterized in that the potential of the channel under the reset gate is detected so that a minimum reset pulse voltage or reset drain voltage required for completing the resetting of the reset transistor is automatically applied to the reset gate or the reset drain. With the feature, the variation of the channel potential under the reset gate caused by the manufacture variation can be compensated, and therefore, the troublesome voltage adjustment procedure for the reset pulse can be omitted.

In addition, since the channel potential and the reset drain voltage can be made substantially equal, a voltage operation margin of the device itself can be consequentially enlarged.

The invention has thus been shown and described with reference to the specific embodiments. However, it should be noted that the present invention is in no way limited to the details of the illustrated structures but changes and modifications may be made within the scope of the appended claims.

I claim:

1. A charge transfer device comprising:
    a charge transfer section having a charge transfer region formed in a semiconductor substrate and transfer electrodes formed on said semiconductor substrate;
    a reset transistor having a floating diffusion region formed in said semiconductor substrate for receiving an electric charge transferred from said charge transfer section, a reset drain applied with a reset voltage, and a reset gate formed above a channel between said floating diffusion region and said reset drain, said reset gate being applied with a reset pulse;
    a peak hold circuit, connected to said reset gate of said reset transistor, for holding a peak level of said reset pulse;
    potential detection means, connected to said peak hold circuit, for indirectly detecting a potential of the channel of said reset transistor when said reset transistor is in a resetting operation; and
    a clamp circuit, connected to said potential detection means, and to said reset drain and said reset gate of said reset transistor, for adjusting a high level of said reset pulse.

2. A charge transfer device claimed in claim 1, wherein said potential detection means includes a dummy transistor having a drain connected to receive a voltage having an absolute value larger than that of said reset voltage, a source grounded through a resistor having a resistance which is considerably larger than an on-resistance of said dummy transistor itself, and a gate electrode connected to an output of said peak hold circuit, said dummy transistor having the same characteristics as that of said reset transistor.

3. A charge transfer device claimed in claim 2 wherein said peak hold circuit includes a diode having an anode connected to said reset gate of said reset transistor and a cathode connected to said gate of said dummy transistor, and a capacitor having one end connected to said cathode of said diode and the other end connected to ground.

4. A charge transfer device claimed in claim 2, wherein said clamp circuit comprises a comparator having a first input connected to said source of said dummy transistor and a second input connected to said reset drain of said reset transistor, a second diode having an anode connected to an output of said comparator and a cathode connected to said reset gate of said reset transistor.

5. A charge transfer device claimed in claim 1 wherein the high level of said reset pulse is adjusted to make the potential of the channel of said reset transistor when said reset transistor is in the resetting operation, consistent with said reset voltage.

* * * * *